United States Patent
Shen et al.

(10) Patent No.: US 10,452,471 B2
(45) Date of Patent: Oct. 22, 2019

(54) NON-VOLATILE MEMORY WITH DYNAMIC WRITE ABORT DETECTION AND RECOVERY

(71) Applicant: WESTERN DIGITAL TECHNOLOGIES, INC., San Jose, CA (US)

(72) Inventors: Zhenlei Shen, Milpitas, CA (US); Nian Niles Yang, Mountain View, CA (US); Chao-Han Cheng, San Jose, CA (US)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 30 days.

(21) Appl. No.: 15/730,454

(22) Filed: Oct. 11, 2017

(65) Prior Publication Data

US 2019/0108090 A1    Apr. 11, 2019

(51) Int. Cl.
| | |
|---|---|
| *G06F 11/10* | (2006.01) |
| *G11C 11/56* | (2006.01) |
| *G06F 12/02* | (2006.01) |
| *G06F 3/06* | (2006.01) |
| *G11C 16/10* | (2006.01) |
| *G11C 29/52* | (2006.01) |

(52) U.S. Cl.
CPC ........ *G06F 11/1048* (2013.01); *G06F 3/0619* (2013.01); *G06F 12/0246* (2013.01); *G11C 11/5628* (2013.01); *G11C 16/105* (2013.01); *G06F 3/0679* (2013.01); *G06F 3/0688* (2013.01); *G11C 29/52* (2013.01)

(58) Field of Classification Search
CPC ............. G06F 11/0793; G06F 11/1072; G06F 3/0679; G06F 12/0246; G06F 11/1048; G06F 3/0619; G06F 3/0688; G11C 11/5628; G11C 29/52; G11C 29/78; G11C 16/10; G11C 16/105
USPC ......................................................... 711/103
See application file for complete search history.

(56) References Cited

U.S. PATENT DOCUMENTS

| | | | | |
|---|---|---|---|---|
| 8,179,719 B1* | 5/2012 | Yang | ........................ | G11C 8/10 |
| | | | | 365/185.03 |
| 2011/0191649 A1* | 8/2011 | Lim | ........................ | G06F 11/10 |
| | | | | 714/752 |
| 2015/0117107 A1* | 4/2015 | Sun | ........................ | G11C 16/10 |
| | | | | 365/185.12 |
| 2016/0055910 A1* | 2/2016 | Tuers | ................... | G11C 16/349 |
| | | | | 365/185.03 |
| 2016/0077903 A1* | 3/2016 | Reddy | .................. | G11C 16/349 |
| | | | | 714/704 |
| 2016/0211014 A1* | 7/2016 | Lee | ....................... | G11C 11/5628 |
| 2018/0032396 A1* | 2/2018 | Sharon | ................ | G11C 11/5642 |

* cited by examiner

*Primary Examiner* — Hashem Farrokh

(74) *Attorney, Agent, or Firm* — Vierra Magen Marcus LLP

(57) ABSTRACT

A non-volatile storage apparatus includes a set of non-volatile memory cells and one or more control circuits in communication with the set of non-volatile memory cells. The one or more control circuits are configured to identify a most recently written portion of the set of non-volatile memory cells and to compare an error rate of data stored in the most recently written portion with a reference error rate from a reference portion of the set of non-volatile memory cells to determine whether the most recently written portion is fully written or partially written.

20 Claims, 16 Drawing Sheets

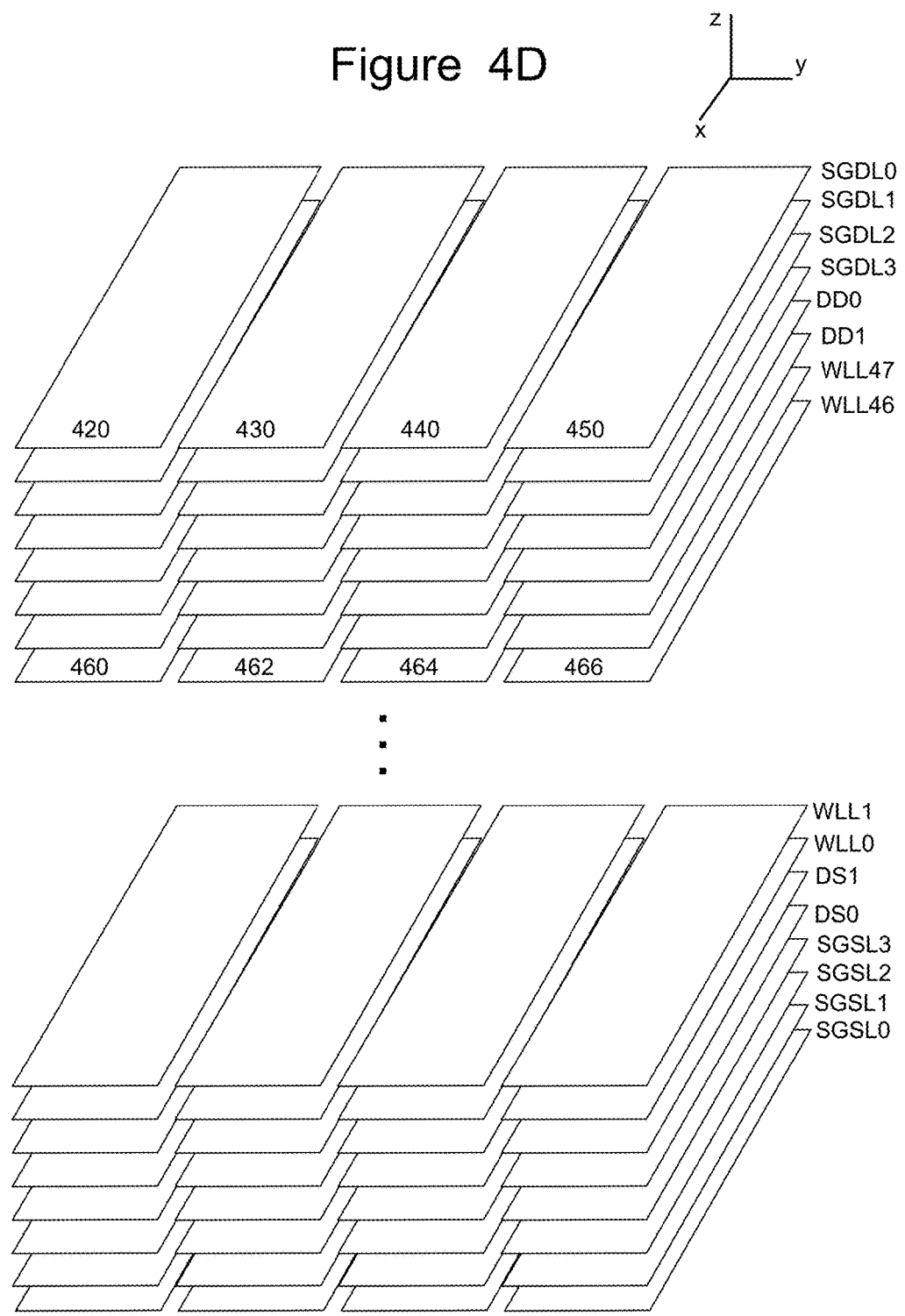

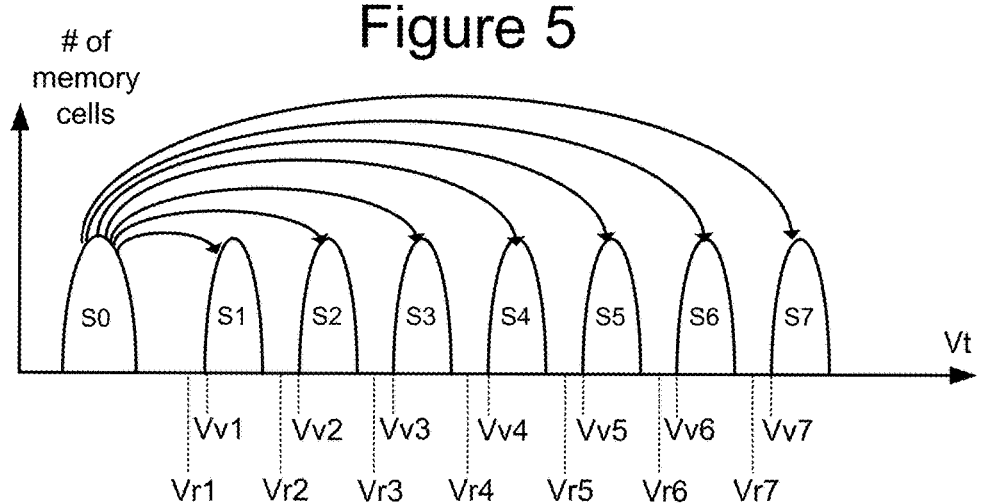
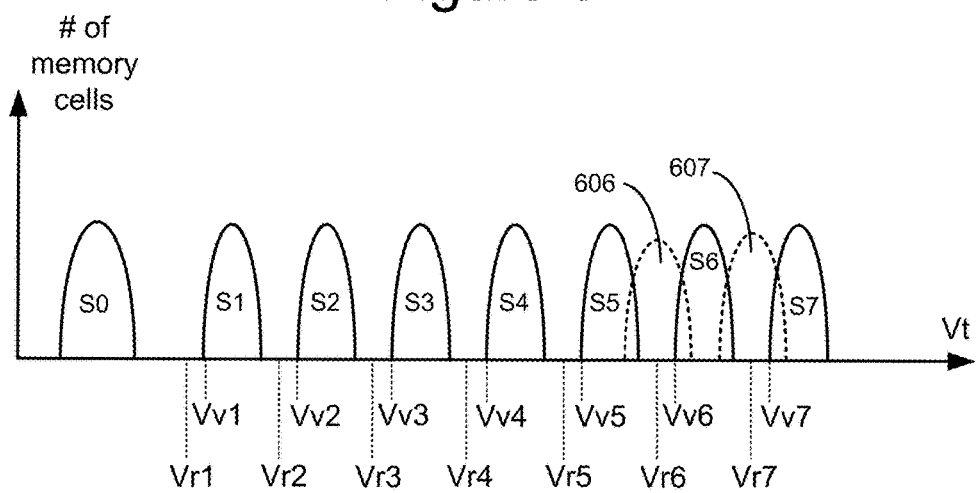

| WL | String 0 | String 1 | String 2 | String 3 |
|---|---|---|---|---|
| 0 | Good | Good | Good | Good |
| ⋮ | Good | Good | Good | Good |
| n-1 | Good | Good | Good | Good |
| n | Good | Partial | Erased | Erased |
| ⋮ | Erased | Erased | Erased | Erased |
| m | Erased | Erased | Erased | Erased |

| WL | String 0 | String 1 | String 2 | String 3 |
|---|---|---|---|---|
| 0 | Good | Good | Good | Good |
| ⋮ | Good | Good | Good | Good |
| n-2 | | Reference | | |
| n-1 | Good | Good | Good | Good |
| n | Good | Partial | Erased | Erased |
| ⋮ | Erased | Erased | Erased | Erased |
| m | Erased | Erased | Erased | Erased |

804

802

Compare BER

Figure 11

Block A

| WL | String 0 | String 1 | String 2 | String 3 |
|---|---|---|---|---|
| 0 | Good | Good | Good | Good |
| ⋮ | Good | Good | Good | Good |
| n-1 | Good | Good | Good | Good |
| n | Good | Partial | | Erased |
| ⋮ | Erased | Erased | Erased | Erased |
| | Erased | Erased | Erased | Erased |

Copy and correct

Block B

| WL | String 0 | String 1 | String 2 | String 3 |
|---|---|---|---|---|
| 0 | Good | Good | Good | Good |
| ⋮ | Good | Good | Good | Good |
| n-1 | Good | Good | Good | Good |
| n | Good | Good | | Erased |
| ⋮ | Erased | Erased | Erased | Erased |
| | Erased | Erased | Erased | Erased |

Figure 12

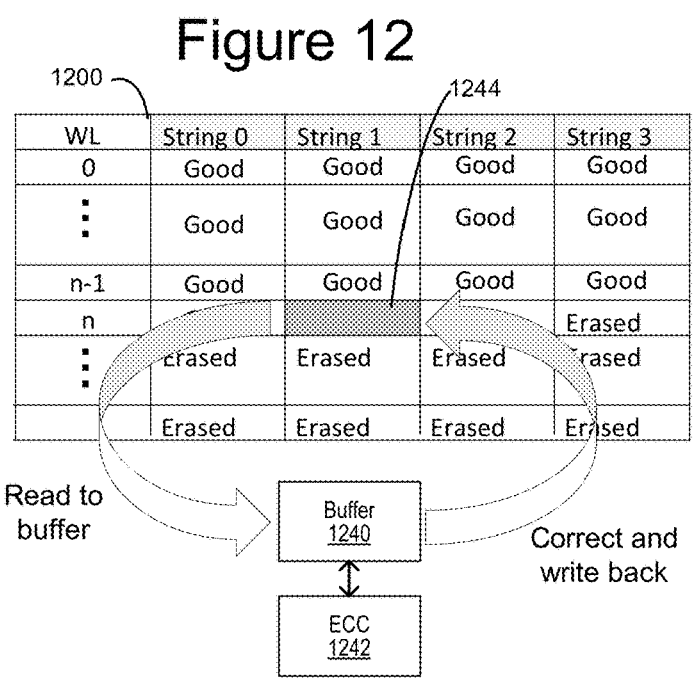

1200, 1244

| WL | String 0 | String 1 | String 2 | String 3 |
|---|---|---|---|---|
| 0 | Good | Good | Good | Good |
| ⋮ | Good | Good | Good | Good |
| n-1 | Good | Good | Good | Good |
| n | | | | Erased |
| ⋮ | Erased | Erased | Erased | Erased |
| | Erased | Erased | Erased | Erased |

Read to buffer → Buffer 1240 ↔ ECC 1242

Correct and write back

NON-VOLATILE MEMORY WITH DYNAMIC WRITE ABORT DETECTION AND RECOVERY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

In some cases, a write operation may terminate before non-volatile memory cells are fully written. Such a write abort may result in partially written non-volatile memory cells in a portion of a non-volatile memory.

BRIEF DESCRIPTION OF THE DRAWINGS

Like-numbered elements refer to common components in the different figures.

FIG. 4D depicts a view of the select gate layers and word line layers.

FIG. 5 depicts threshold voltage distributions.

FIG. 6 illustrates threshold voltage distributions for partially written data.

FIG. 7 shows an example of a block that includes partially written data.

FIG. 8 illustrates detection of partially written data using a reference word line in the same block.

FIG. 11 illustrates copying of corrected partially written data to another block.

FIG. 12 illustrates fully writing partially written data in-situ.

DETAILED DESCRIPTION

Figure 1:
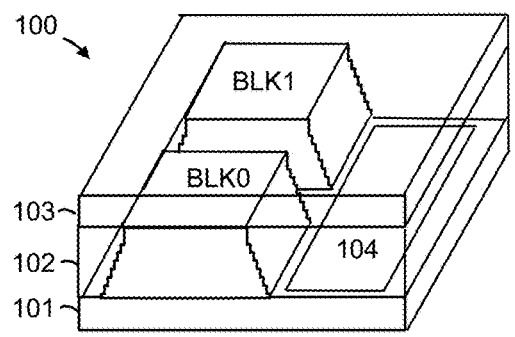
FIG. 1 is a perspective view of a 3D stacked non-volatile memory device.

In a non-volatile memory system, a write operation may be interrupted (e.g. due to loss of power) causing a write abort to occur. A portion of a memory array (e.g. a page) may be only partially programmed in this case. When a write abort occurs, there may be no explicit indication as to whether the write operation was completed or not, or how close the write operation was to completion. Detecting a write abort (e.g. when power is restored after a power loss) may include finding the most recently written page in the memory array and checking if the data there is fully written, for example, by seeing if the error rate exceeds a limit. In some cases, the error rate is high (e.g. data may be uncorrectable, or may be correctable with a high number of errors) and it is clear that a write abort has occurred. In other cases, the error rate is low enough to be correctable by ECC and it may be unclear whether the data is fully written or partially written (e.g. if it is nearly fully written, or "marginal") from a predetermined limit. Error rates vary from word line to word line, from block to block, and according to conditions (e.g. temperature, wear, and other factors) so that simply comparing an error rate for the most recently written data with a predetermined limit may not always be an accurate test for detecting a write abort. Fully written data may have a high error rate because of its location (e.g. in a block with high error rates) environmental conditions, or other reasons, and may be falsely identified as partially written. Partially written data that was nearly fully written may have a low error rate for similar reasons and may be misidentified as fully written.

An example of dynamic write abort detection compares an error rate of the most recently written page in memory with an error rate from a fully written page that is expected to have a similar error rate (e.g. because it is physically close, in the same block, or similarly situated in a neighboring block). If the error rate (e.g. bit error rate, or BER) of the most recently written page(n), BER(n), is within an acceptable range of the BER of the reference page (e.g. less than or equal to K*BER(ref), where BER(ref) is the BER of the reference page) then page(n) may be considered fully programmed, while if it is outside the acceptable range (e.g. BER(n)>K*BER(ref)) then page(n) may be considered partially programmed indicating that a write abort has occurred. The value of K may be obtained from error rate distribution data. For example, if a reference page is in the same block as the last written page, K may be obtained from page-to-page distribution of error rates for a block (e.g. K=1.1 where an error rate distribution has a range of 10%). If a reference page is in a different block, K may be obtained from a block-to-block distribution of error rates. Error rate distribution data (e.g. values of K) may be stored and used in write abort detection.

When a write abort results in a partially written page, programming may be resumed to complete programming of the partially written page. For example, a correct version of the data (e.g. from ECC or from an original copy) may be loaded into a write buffer and a write operation may be initiated to fully program the data at the same location that was partially written (i.e. without relocating the data to a new location).

FIGS. 1-4F describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks of memory cells, including BLK0 and BLK1, formed of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block of memory cells comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
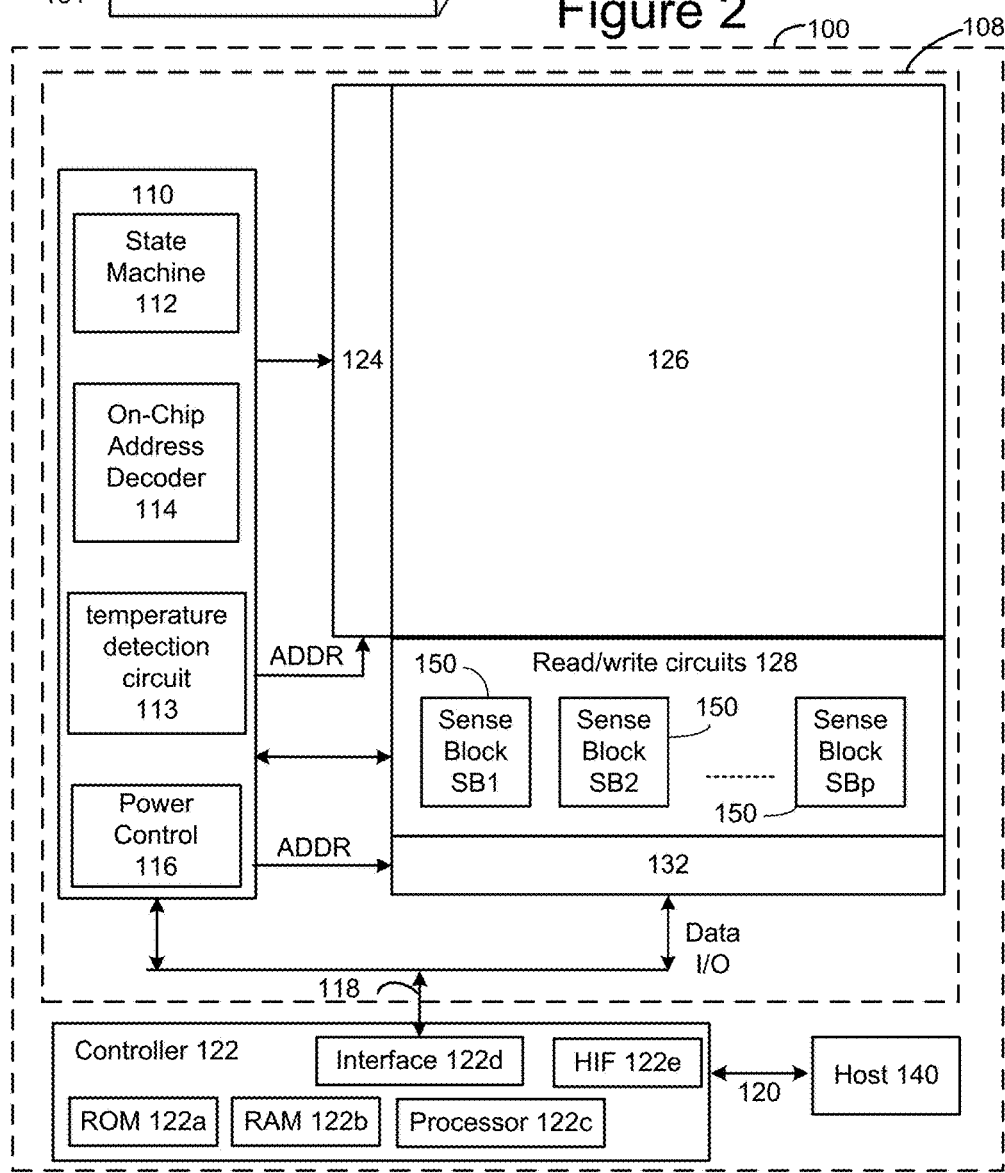
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a decoder 124 (row decoder) and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device, such as memory device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

Controller 122 (which in one embodiment is an electrical circuit that may be on-chip or off-chip) may comprise one or more processors 122c, ROM 122a, RAM 122b, Memory interface 122d and Host Interface 122e, all of which are interconnected. One or more processors 122C is one example of a control circuit. Other embodiments can use state machines or other custom circuits designed to perform one or more functions. The storage devices (including ROM 122a, RAM 122b) comprises code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
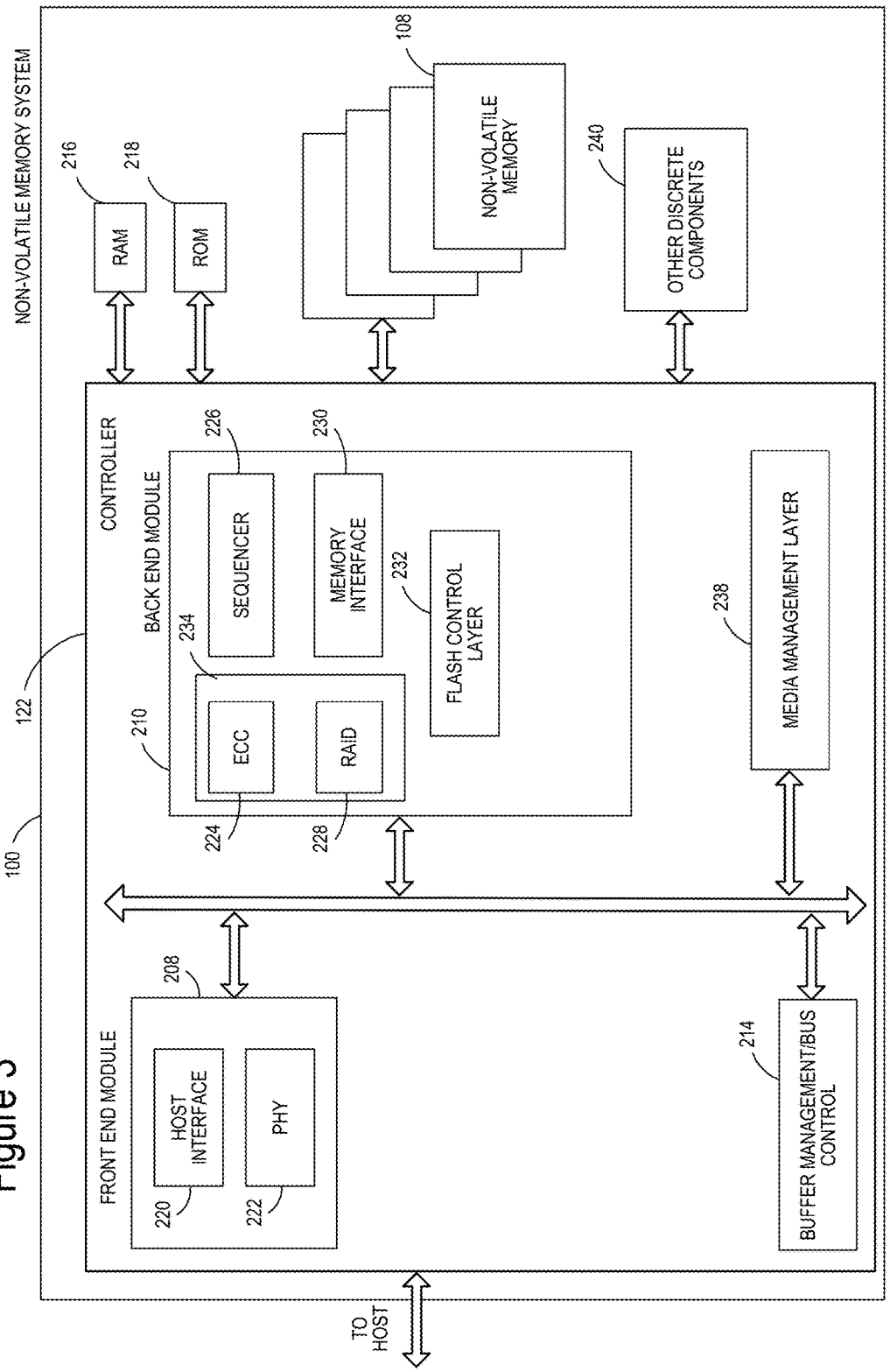
FIG. 3 is a block diagram depicting one embodiment of a Controller.

FIG. 3 is a block diagram of example memory system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed memory cells. Some part of the spare memory cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The communication interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid-state disk (SSD) drive installed in a personal computer.

In some embodiments, memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front-end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back-end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back-end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory structure 126 of memory die 108. The MML 238 may be needed because: 1) the flash memory may have limited endurance; 2) the flash memory structure 126 may only be written in multiples of pages; and/or 3) the flash memory structure 126 may not be written unless it is erased as a block (i.e. a block may be considered to be a minimum unit of erase and such a non-volatile memory may be considered a block-erasable non-volatile memory). The MML 238 understands these potential limitations of the flash memory structure 126 which may not be visible to the host. Accordingly, the MML 238 attempts to translate the writes from host into writes into the flash memory structure 126.

Controller 122 may interface with one or more memory die 108. In in one embodiment, Controller 122 and multiple memory dies (together comprising memory system 100) implement a solid-state drive (SSD), which can emulate, replace or be used instead of a hard disk drive inside a host, as a NAS device, etc. Additionally, the SSD need not be made to work as a hard drive.

Figure 4:
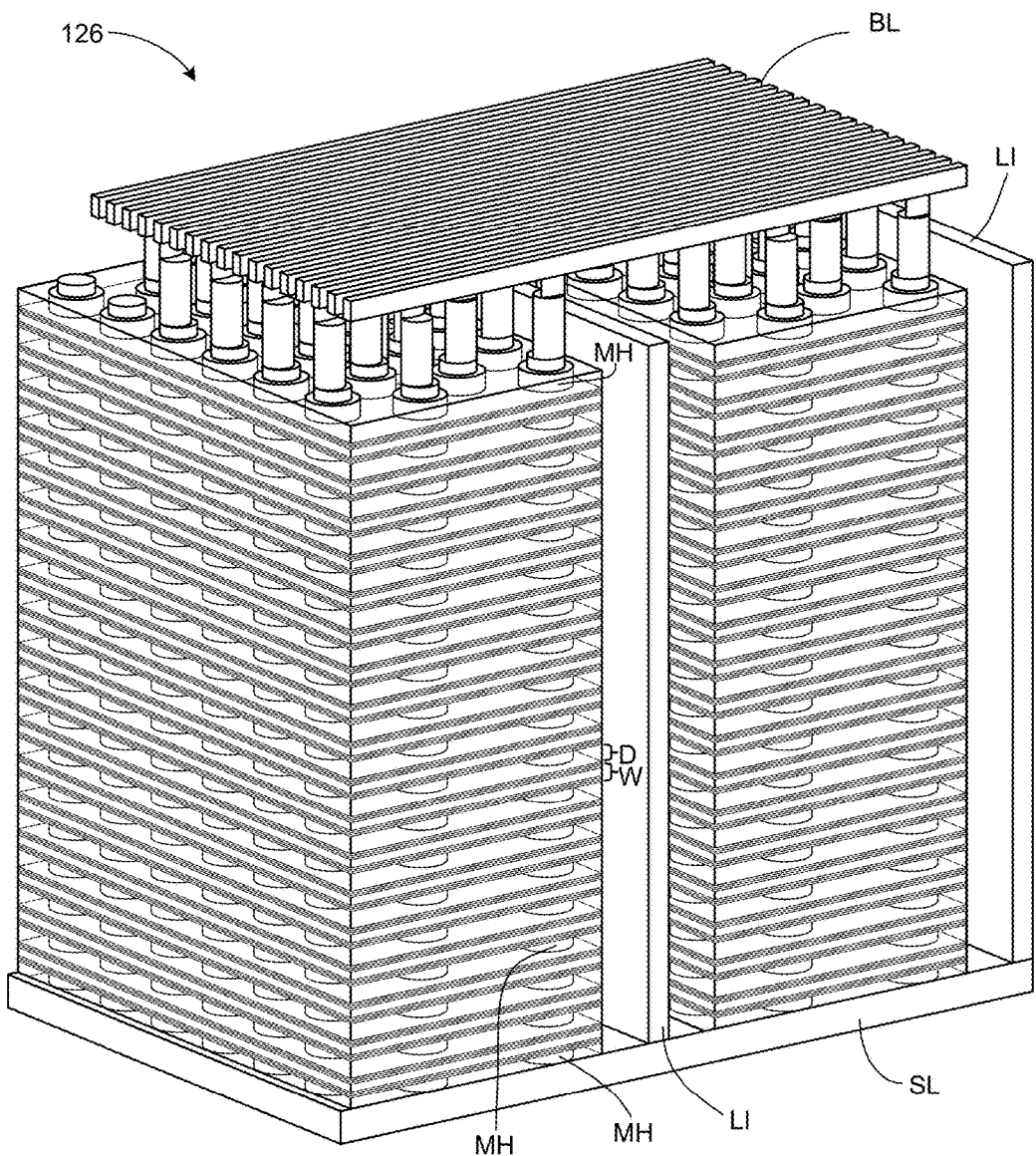
FIG. 4 is a perspective view of a portion of one embodiment of a three-dimensional monolithic memory structure.

FIG. 4 is a perspective view of a portion of a three-dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional memory structure 126 is provided below with respect to FIG. 4A-4F.

Figure 4A:
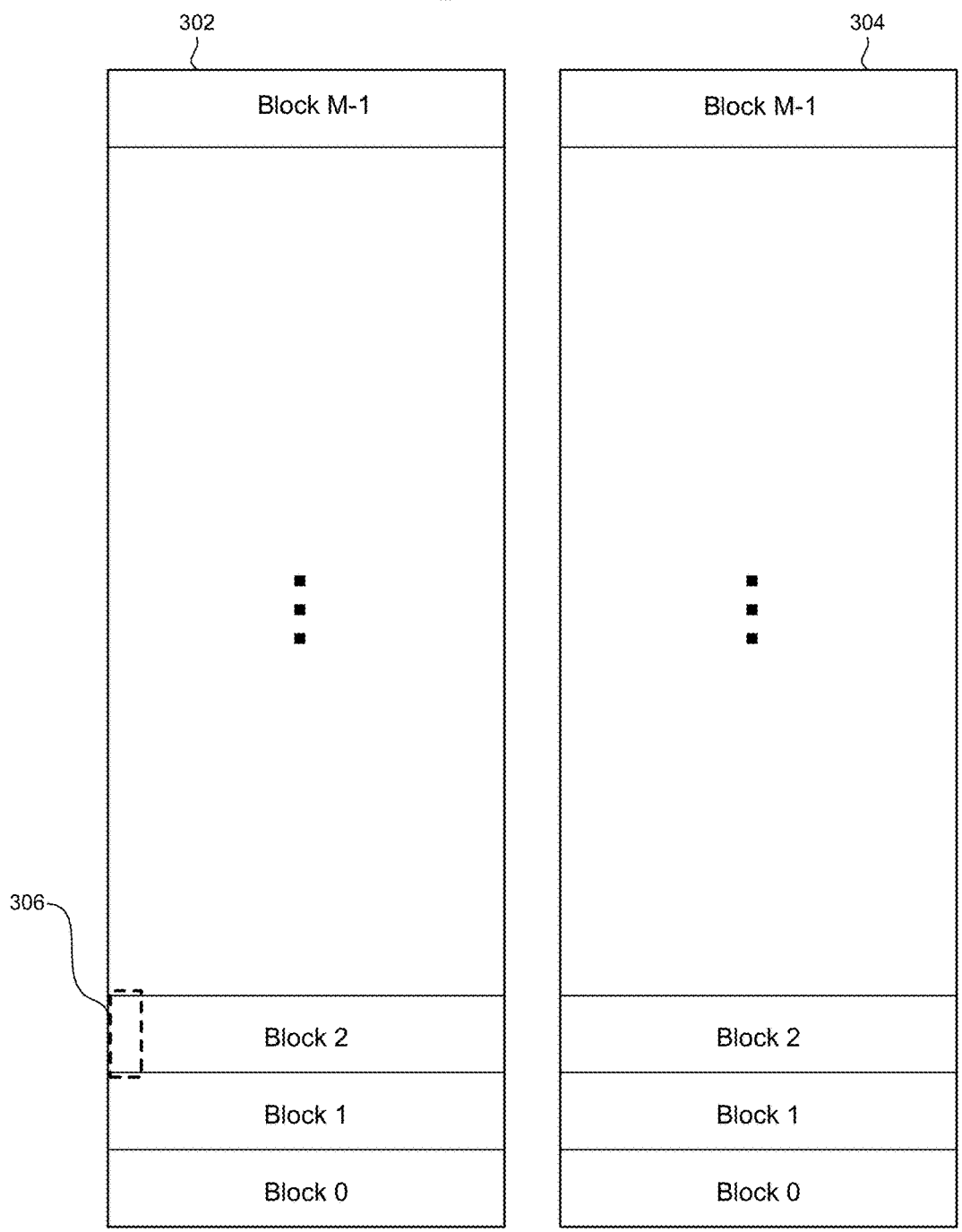
FIG. 4A is a block diagram of a memory structure having two planes.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
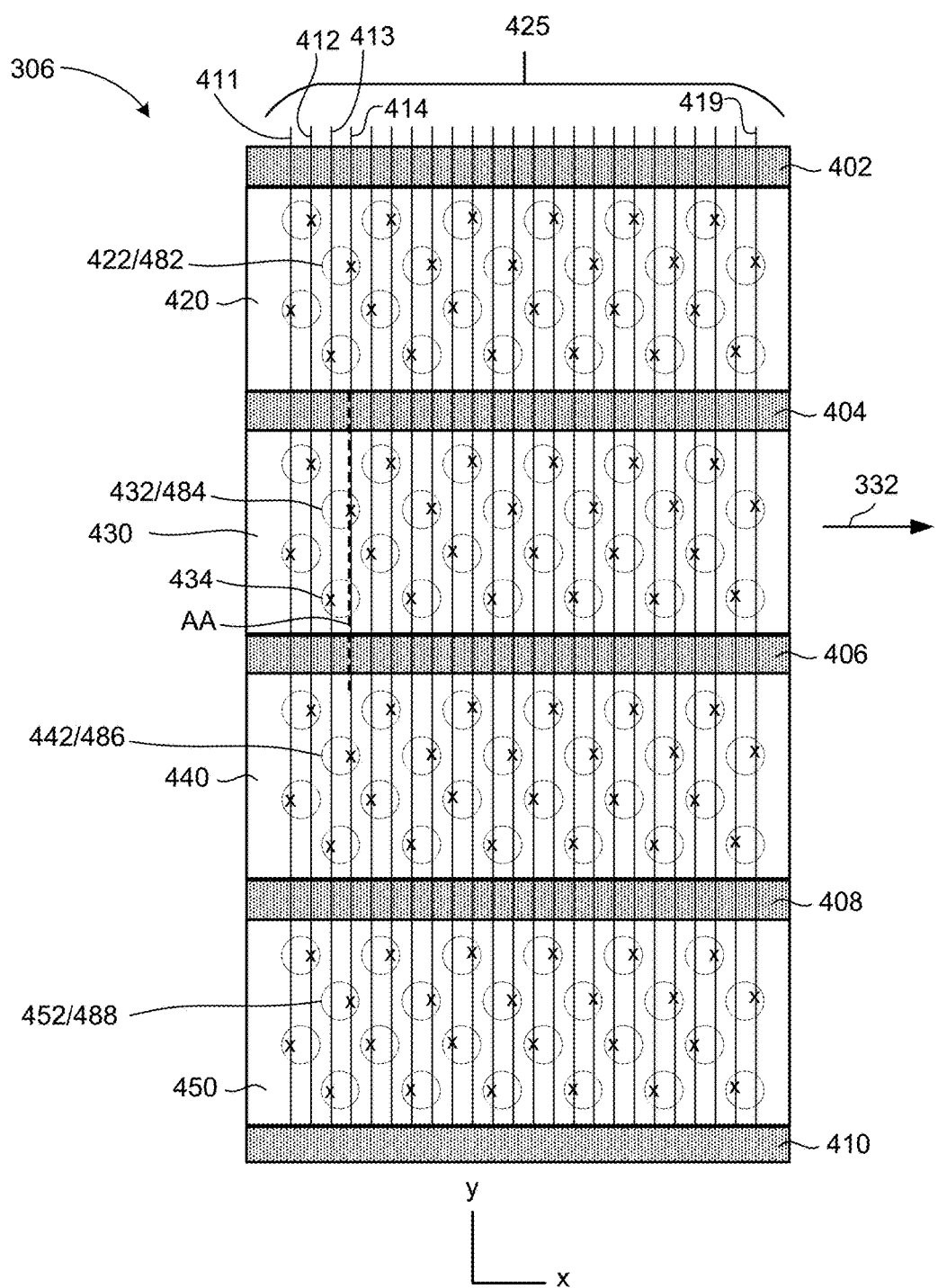
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B shows vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 425, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
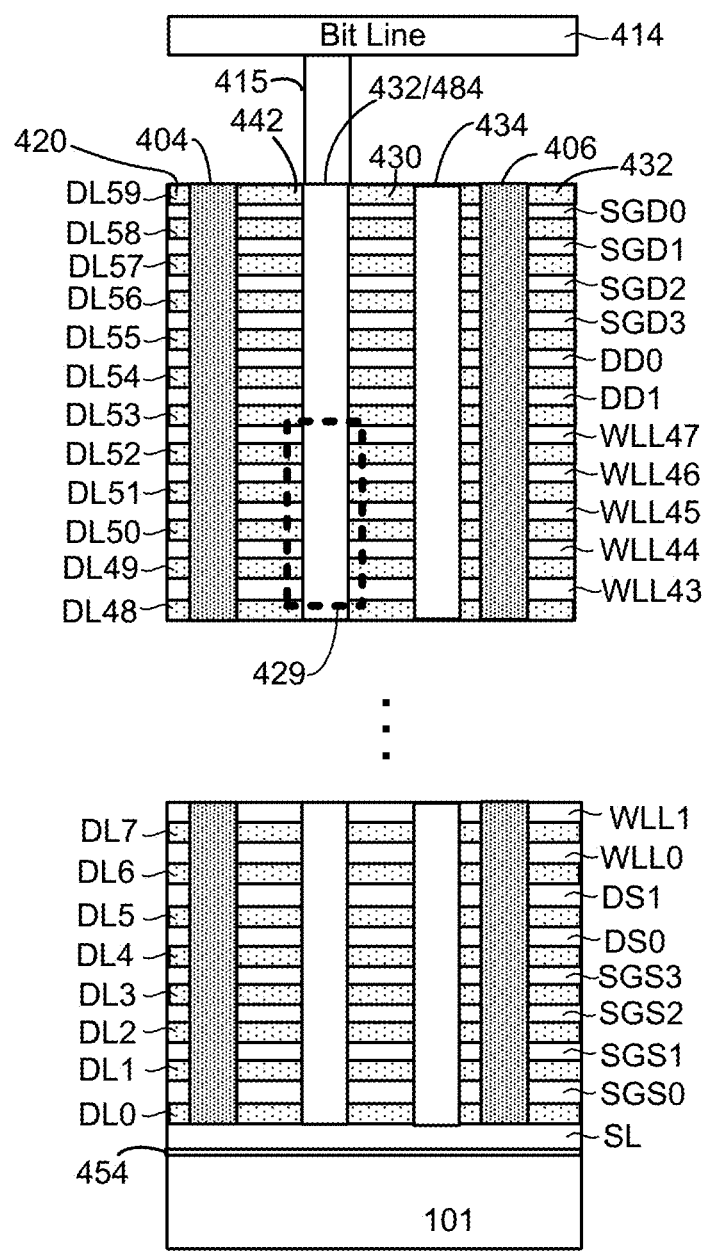
FIG. 4C depicts a cross sectional view of a portion of a block of memory cells.

FIG. 4C depicts a portion of an embodiment of three-dimensional memory structure 126 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells. Other embodiments can implement more or less than four drain side select layers, more or less than four source side select layers, more or less than four dummy word line layers, and more or less than forty-eight-word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to bit lines 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment, local interconnects 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
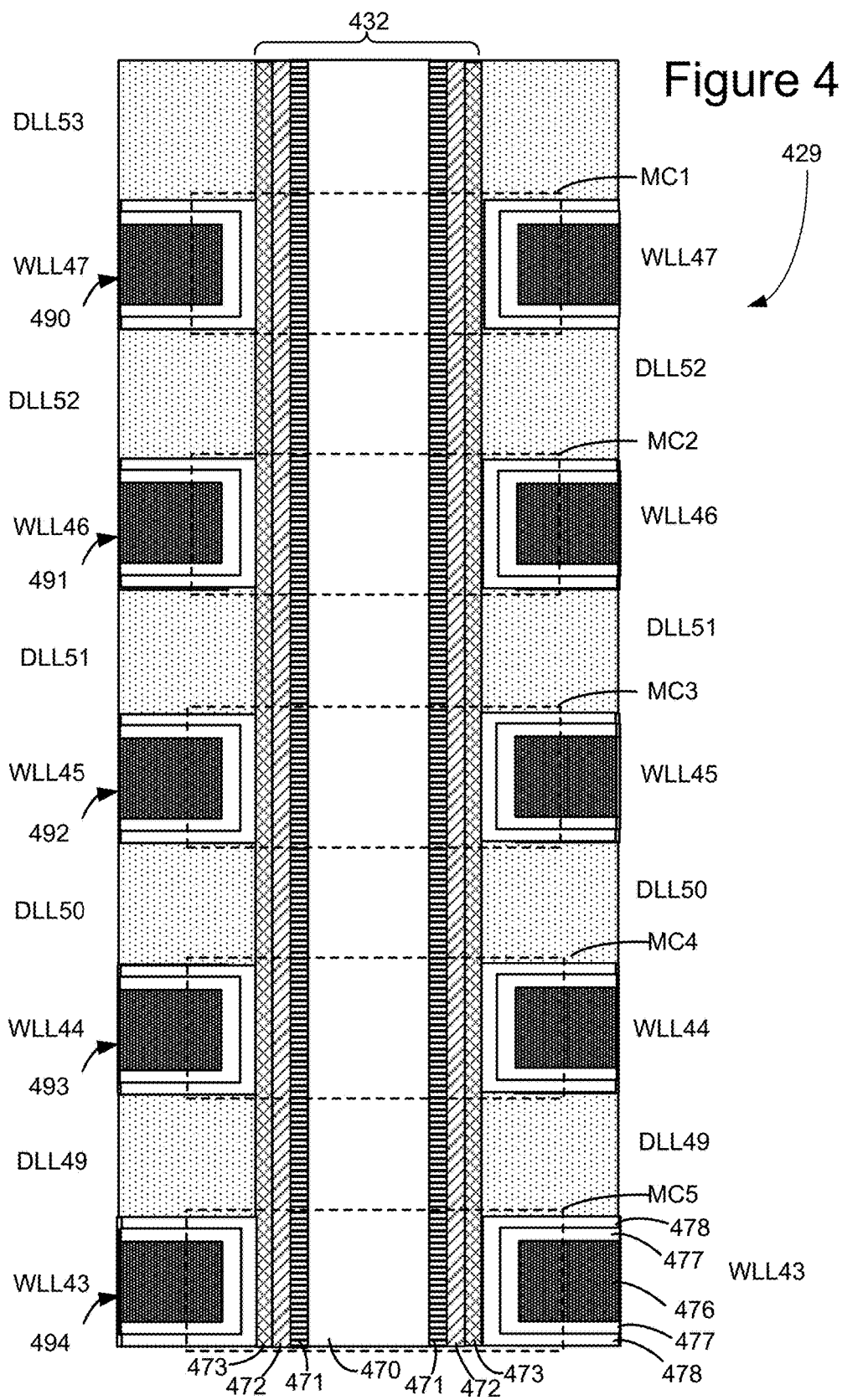
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included, and other shapes can be used. In one embodiment, vertical column 432 includes an inner core 470 that is made of a dielectric, such as $SiO_2$. Other materials can also be used. Surrounding inner core 470 is a polysilicon channel, channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide layer 478 (SiO2). The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming a non-volatile storage system is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
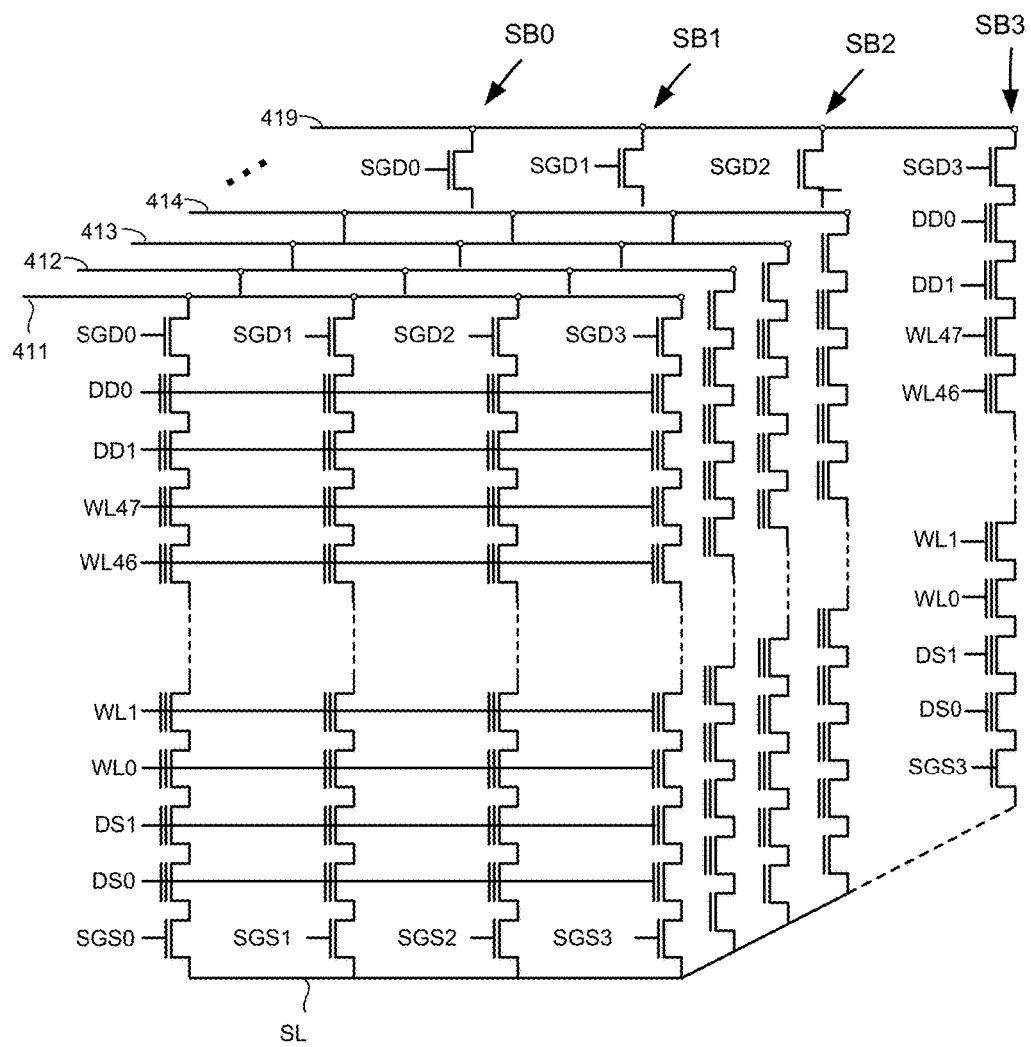
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three-dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the memory cell, one above and one below the memory cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with Controller 122 relying on ECC to identify the correct data being stored.

Sometimes, when data is read from non-volatile memory cells, one or more bad bits may be encountered. For example, a memory cell that was programmed to data state S5 and was verified as having a threshold voltage above Vv5, may subsequently be read as having lower threshold voltage between Vr4 and Vr5 that causes it to be read as being in state S4. Threshold voltages may also appear higher than originally programmed threshold voltages. A memory cell initially programmed to data state S5 and verified as having a threshold voltage above Vv5 may subsequently be read as having a threshold voltage between Vr6 and Vr7 that causes it to be read as being in data state S6. Such changes in threshold voltages may occur because of charge leakage over time, effects of programming or reading, or some other reason. The result may be one or more bad bits (flipped bits) in a portion of data that is read from a set of memory cells (i.e. a logic 1 may be flipped to a logic 0, or a logic 0 may be flipped to a logic 1). In some cases, a write operation may terminate before non-volatile memory cells are fully written in what may be referred to as a "write abort." Partially written data does not have memory cells in their final data states (i.e. not as shown in FIG. 5), which may result in a number of bad bits when the partially written data is read.

Because errors can occur when programming, reading, or storing data (e.g., due to electrons drifting, data retention issues or other phenomena) memory systems often use Error Correction Codes (ECC) to protect data from corruption. Many ECC coding schemes are well known in the art. These error correction codes are especially useful in large scale memories, including flash (and other non-volatile) memories, because of the substantial impact on manufacturing yield and device reliability that such coding schemes can provide, rendering devices that have a few non-programmable or defective memory cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other cases, the data being encoded is transformed during encoding.

In some embodiments, a controller, such as Controller 122, receives host data, also referred to as information bits, that is to be stored memory structure 126. The informational bits are represented by the matrix if=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes may be applied to multiple pages encoded across a number of storage elements, but they do not need to be applied across multiple pages. The data bits can be mapped to a logical page and stored in the memory structure 126 by programming one or more memory cells to one or more programming states, which corresponds to v.

When a write operation fails to complete (because of power loss or for some other reason), memory cells may be left in intermediate states that do not reflect their fully programmed states. Detecting such a partially written condition may be performed as part of a power up routine. For example, a binary search may be performed in a memory to identify the most recently written portion of the memory. In general, writing is performed in a unit of a page so that one page (or in some schemes two or more pages) may be partially programmed in a given unit of memory. Where pages are programmed in different units in parallel (e.g. different dies, or blocks), each unit may be searched for the most recently written page. When the most recently written page is found, the page may be examined to determine if the data stored in the page is fully written.

If a write abort occurs early in a write operation, when memory cells are far from their fully programmed threshold voltages, a write abort may be clearly indicated by a large number of bad bits (e.g. found by ECC or comparing with a known good copy of the data). However, if a write abort occurs when a write operation is nearly complete, the number of bad bits may be relatively small, which makes detection of a write abort more difficult. Such a marginal write may provide partially written data that is correctable by ECC but that has a high risk of becoming uncorrectable because programming was not completed.

FIG. 6 illustrates an example of a population of multi-level cell (MLC) memory cells that are partially (marginally) written. Programming of data states S1-S5 is complete, with programming of data states S6 and S7 being partially complete as indicated by partially programmed distributions 606 and 607 (distributions shown by dotted lines). Thus, six of the eight data states are fully programmed (the erased state S0 may be considered "fully programmed" even though it does not require programming from the erased state as other logic states do). Distributions 606 and 607 provide large numbers of good bits because a significant portion of distribution 606 is higher than Vr6 resulting in memory cells that are read as being in the S6 data state while a significant portion of distribution 607 is higher than Vr7 resulting in memory cells that are read as being in the S7 data state. However, such marginally programmed data may have a high risk of becoming uncorrectable over time because distributions 606 and 607 overlap read voltages Vr6 and Vr7 respectively so that small shifts in distributions 606 and 607 may significantly affect read data. Because of the relatively small number of bad bits, detection of such a condition may be challenging.

FIG. 7 illustrates an example of a partially programmed block 700 that includes partially written page 702 (e.g. a page with memory cell threshold voltages as shown in FIG. 6), as a result of a write abort. A word line forms the unit of writing in this example, so that a word line may be considered a physical page (in other memories a physical page may not correspond to a word line). Block 700 may be formed in a three-dimensional memory structure such as a 3-D NAND flash memory as illustrated in FIGS. 4-4F. Word lines 0 to n−1 are fully written for all strings and word lines n+1 to m (last word line of block) are erased as may be found from a binary search. Word line n of string 0 and string 1 are written while word line n of string 2 and string 3 are erased. Thus, word line n of string 1 is the most recently written word line in block 700. It may be assumed that previously written word lines are fully written ("Good") in this example, in some cases, there may be more than one partially written word line (e.g. where word lines are written in phases so that word line n−1 could also be in a partially written condition). Identifying the most recently written portion of a non-volatile memory may include performing a binary search of the non-volatile memory to identify a boundary between a written portion and an unwritten portion.

A binary search may identify a boundary between written and erased word lines of a given set of non-volatile memory cells (e.g. a block, die, bank, or other unit) by starting at a middle word line (e.g. word line m/2), performing a read, and if it is not written, looking midway between the start of the block and the middle (e.g. word line m/4). When a written word line is encountered, a binary search looks midway between the written word line and the nearest word line known to be erased (e.g. if word line m/4 is written then look half way between m/4 and m/2). Thus, the search area is cut in half at each step until a boundary is found (e.g. a written word line that is next to an erased word line). Other search patterns may also be used. In some cases, the most recently written word line is known, and no search is necessary. Control circuits in a memory controller or elsewhere may be configured to perform a binary search or other scheme to identify a most recently written portion of a set of non-volatile memory cells, e.g. after an unexpected power loss that may have affected a write operation.

FIG. 8 illustrates an example of dynamic write abort detection. Word line 802 is the most recently written page in block 800. In order to determine if a write abort has occurred, an error rate may be found for data read from word line 802. For example, an ECC decoder (e.g. ECC engine 224) may provide a BER for data read from word line 802. In some cases, a good copy may be available for comparison (e.g. a buffered copy, or a copy from a host) so that the number of bad bits can be found by comparison (e.g. XORing the good copy and the copy from word line 802). A reference word line 804 is identified such that the error rates of reference word line 804 and word line 802 are expected to be similar. In this case, reference word line 804 is a fully written word line in the same block (block 800) as word line 802, in the same string (string 1) and is close (separated by only word line n−1) so that their error rates would be expected to be similar. In other examples, a different reference word line may be chosen. A BER is obtained for data read from reference word line 804. An error rate of data stored in the most recently written portion (BER for word line 802) is compared with a reference error rate from a reference portion (BER for reference word line 804) of the set of non-volatile memory cells of block 800 to determine whether the most recently written portion is fully written or partially written. Suitable control circuits, such as control circuits of controller 122, may be configured to identify a most recently written portion of a set of non-volatile memory cells (e.g. word line 802) and to compare an error rate of data stored in the most recently written portion with a reference error rate from a reference portion (e.g. reference word line 804) of the set of non-volatile memory cells to determine whether the most recently written portion is fully written or partially written.

Comparison of error rates may be performed in a variety of ways, e.g. by control circuits in a controller configured to receive error rates from an ECC decoder such as ECC engine 224. For example, if the BER for data from word line 802 is not more than K times the BER for data from reference word line 804 then word line 802 may be considered fully written. If the BER for data from word line 802 is more than K times the BER for data from reference word line 804 then word line 802 may be considered partially written thus indicating that a write abort has occurred. The value of K generally provides some margin for variation between word lines so that word line 802 is considered fully written as long as its BER is within a certain margin of the BER of reference word line 804.

Figure 9:
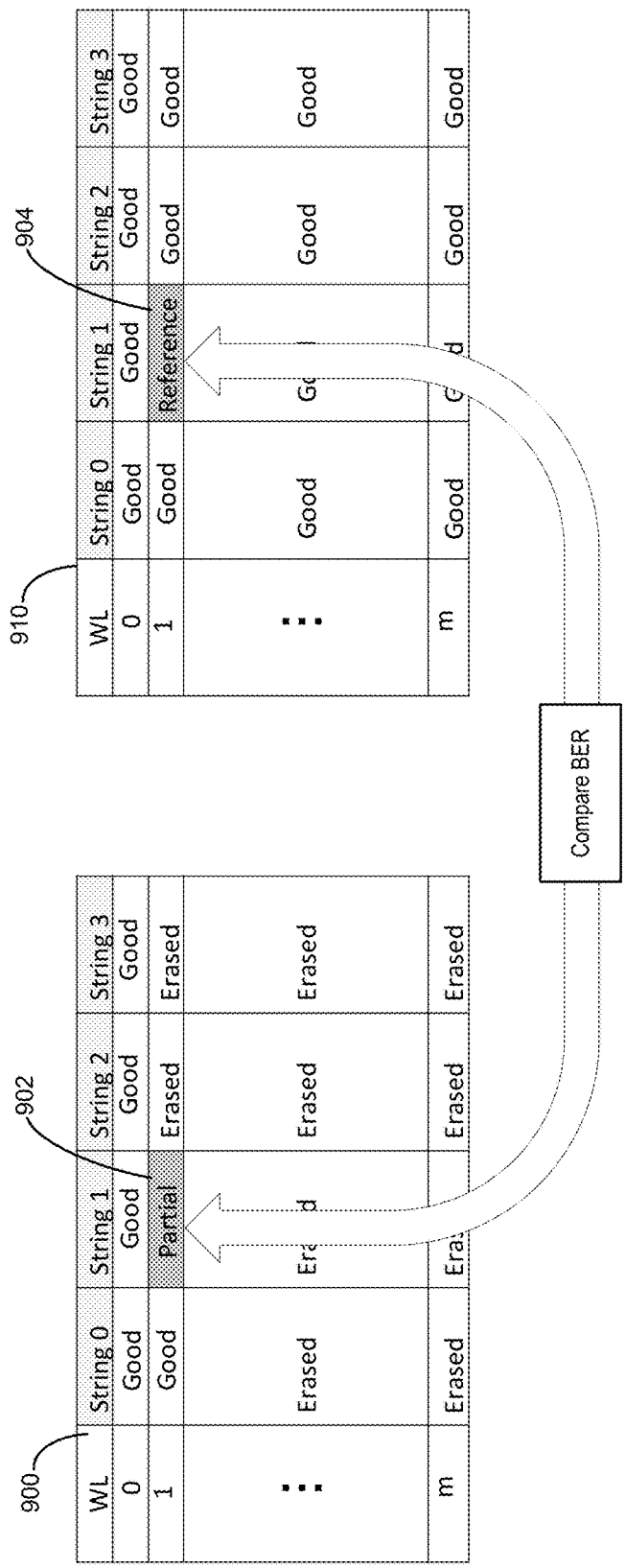
FIG. 9 illustrates detection of partially written data using a reference word line in a different block.

FIG. 9 illustrates another example of dynamic write abort detection in which a reference word line is found in a different block to the block containing the word line that is being checked for a write abort. For example, in some cases, where the number of written word lines in a block is insufficient, a reference word line may be found outside the block. FIG. 9 shows block 900 containing word line 902, which is the most recently written word line in block 900. Block 900 contains few written word lines. Word line 0 is written in all strings and word line 1 is written in two strings. While word line 0 of string 1 could be used as a reference word line, because it is adjacent to word line 902, it may be affected by a partial write of word line 902 and is not selected (in other examples, where interactions between word lines was less, it could be selected). Some schemes may require one or more word lines between a word line being checked and a reference word line so that if the number of written word lines is small, there may be no suitable reference word line in the same block. Reference word line 904 is in block 910, which is physically close (in this case, immediately adjacent) to block 900 and has similar characteristics. Reference word line 904 is word line 1 of string 1 of block 910, the same location that word line 902 occupies in block 900. Thus, reference word line 904 and word line 902 may be expected to have a similar error rates. An error rate is obtained for data in word line 902 in block 900 and another error rate is obtained for data from reference word line 904 in block 910. The error rate of data stored in the most recently written portion (BER for word line 902) is compared with a reference error rate from a reference portion (BER for reference word line 904) of the set of non-volatile memory cells of blocks 900 and 910 to determine whether the most recently written portion is fully written or partially written. Suitable control circuits, such as control circuits of controller 122, may be configured to identify a most recently written portion of a set of non-volatile memory cells (e.g. word line 902) and to compare an error rate of data stored in the most recently written portion with a reference error rate from a reference portion (e.g. reference word line 904) of the set of non-volatile memory cells to determine whether the most recently written portion is fully written or partially written.

Comparison of error rates from different blocks may be performed in a similar manner to comparison of error rates from different word lines of the same block. For example, if the BER for data from word line 902 is not more than K times the BER for data from reference word line 904 then word line 902 may be considered fully written. If the BER for data from word line 902 is more than K times the BER for data from reference word line 904 then word line 902 may be considered partially written thus indicating that a write abort has occurred. The value of K used may be different depending on whether the reference word line is in the same block or a different block. This reflects the different variation in error rates within blocks and from block-to-block.

The value of K may be obtained from error rate distribution data. For example, such data may be collected during testing, from modeling, from observed ECC correction during operation, or otherwise. Error rate distribution data may be gathered for an entire non-volatile memory, or may be gathered from a sample portion of non-volatile memory. For example, error rate distribution data for word lines of a block may be gathered from a sample population of blocks to provide a value of K that represents expected word line to word line error rate variation within a block. Error rate distribution data for block to block variation may also be gathered from a sample population of blocks to provide a value of K that represents expected block to block error rate variation. Other values of K may be used to accommodate different reference word lines in different configurations. One or more values of K may be stored for use in write abort detection (e.g. one or more word line to word line value and/or one or more block to block value). Error distribution data, such as one or more values of K, may be stored in a table or other format in a memory system.

Figure 10:
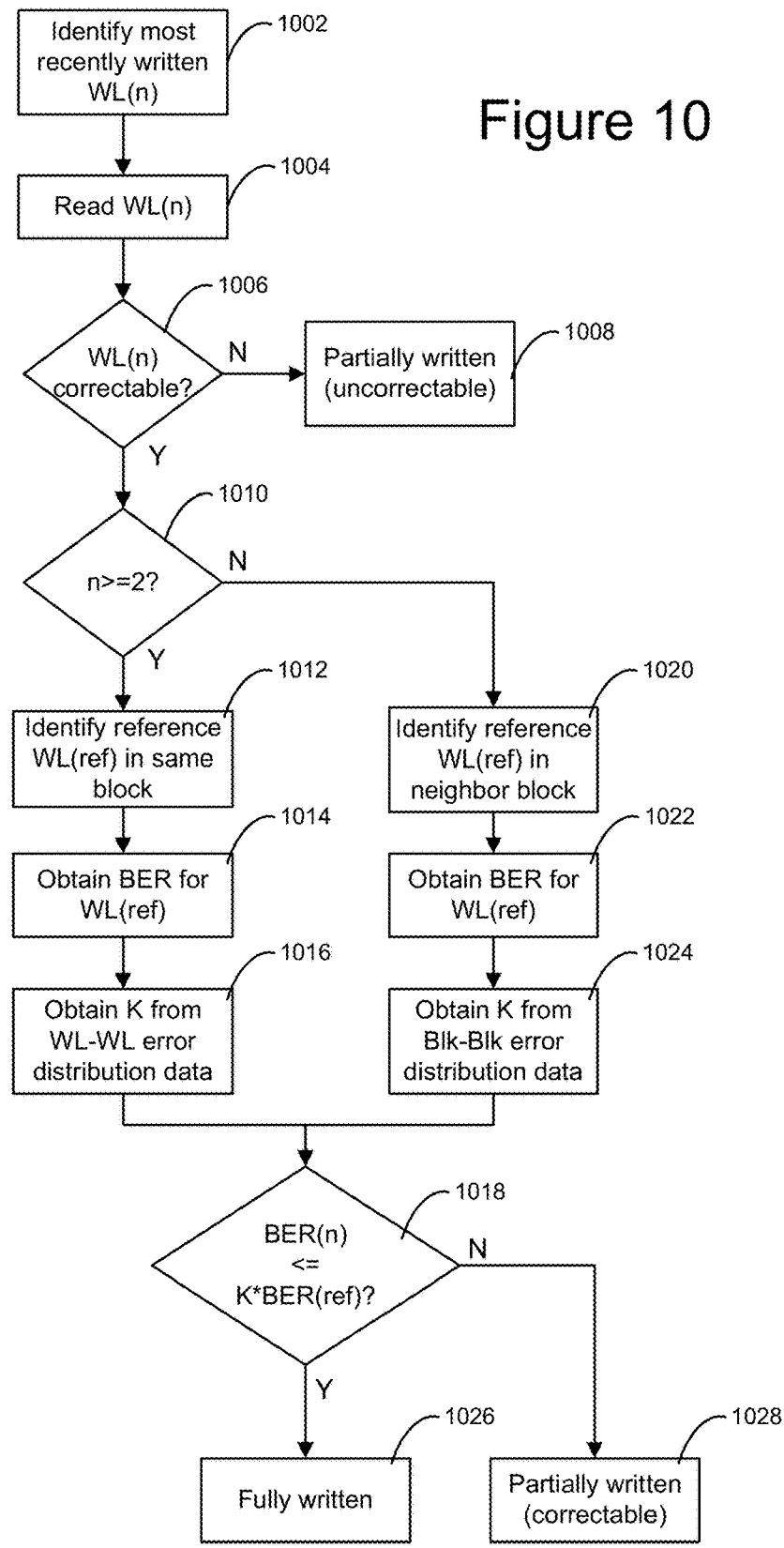
FIG. 10 illustrates an example of a method for detecting partially written data.

There are several advantages to using a comparison of error rates with a nearby reference portion of a memory array to determine whether the most recently written portion is fully written. This provides a dynamic measure that adjusts to local variations in error rates across a set of non-volatile memory cells. Furthermore, by reading from a reference portion and obtaining an error rate as part of this determination, temperature and other time-dependent variation is removed (i.e. the error rates reflect data read at about the same time, at about the same temperature, from memory cells subject to the same conditions). Thus, the comparison techniques of FIGS. 8 and 9 reduce effects of error rate variation with physical location and over time to provide a more accurate indicator of a write abort condition. While the reference portions used in the examples of FIGS. 8 and 9 are single word lines, in other examples, multiple word lines may be used, e.g. an average may be obtained from several nearby word lines, and in some cases error rate distribution data may also be gathered from multiple word lines either instead of, or in addition to, stored error rate distribution data. The reference portion need not be the same size as the most recently written portion that is being checked for write abort, i.e. where a page is being checked FIG. 10 illustrates an example of a method of using the present technology. A most recently written portion of a non-volatile memory (WL(n)) is identified 1002. Data is then read from WL(n) 1004 and a determination is made as to whether data of WL(n) is correctable 1006 (e.g. an ECC decoder attempts to decode data from WL(n)). If the data of WL(n) is not correctable then this indicates that WL(n) is partially written (uncorrectable) 1008. If the data of WL(n) is correctable then its error rate, BER(n) is obtained from ECC decoding, and a determination is made as to whether the block containing WL(n) has enough written word lines to provide a good reference word line, in this example n≥2 1010. Thus, in this example, the most recently written word line WL(n) must be at least WL(3) to allow selection of a reference word lines that is not adjacent to a word line that may be partly written (e.g. WL(0) is separated from WL(2) by WL(1)). It will be understood that in other non-volatile memories, there may be different requirements for determining that a block contains a fully written portion that is representative of the block.

If n≥2 then a reference word line, WL(ref), is identified in the same block 1012, for example WL(n−2) in the same string as WL(n). Data is read from WL(ref) and a BER is obtained for WL(ref) 1014 (e.g. using an ECC decoder). A value of K is obtained from word line to word line error distribution data 1016. The error rate of data from WL(n), BER(n), is then compared with the error rate of data from WL(ref), BER(ref). Error rate distribution data is used in this comparison to account for word line to word line error variation by applying the comparison BER(n)≤K*BER(ref), where K reflects word line to word line variation within a block.

If n<2 then a reference word line, WL(ref), is identified in a neighboring block 1020, for example a similarly located word line in a block that is physically close to the block containing WL(n). Data is read from WL(ref) and a BER is obtained for WL(ref) 1022 (e.g. using an ECC decoder). A value of K is obtained from block to block error distribution data 1024. The error rate of data from WL(n), BER(n), is then compared with the error rate of data from WL(ref), BER(ref) using the value of K obtained from block to block error distribution data by applying the comparison BER(n)≤K*BER(ref) 1018, where K reflects block to block error rate variation.

This comparison of BER(n) and K*BER(ref) 1018 determines a condition of the most recently written portion of the non-volatile memory, WL(n), as either fully written 1026, when BER(n)≤K*BER(ref), or partially written (correctable) when BER(n)>K*BER(ref) 1028, i.e. when write abort has caused data to be partially written.

When a partially written, or marginal page is detected (e.g. by a process as illustrated in FIG. 10 or otherwise) corrective action may be taken to ensure that a good copy of the data is available in memory. FIG. 11 shows an example in which partially written data from WL(n) is copied from Block A to Block B and a corrected copy is written in Block B (e.g. data from WL(n) is corrected by ECC and then the corrected copy is written in Block B). All other data from Block A is copied also and data in Block A may become obsolete as a result of this copying so that Block A is erased. Such copying of data may be time consuming and may delay recovery after a power loss.

FIG. 12 illustrates an example of corrective action that may be taken without copying a large amount of data to a new block. In many memory systems, including flash memory systems, an erase operation is performed between write operations (i.e. data cannot be overwritten in memory cells). Programming may only increase threshold voltages in such systems and an erase operation is performed to reduce threshold voltages to a common erased range prior to programming. Non-volatile memory cells that are partially programmed may be further programmed with the same data without an erase operation. In this case, there is no overwriting of new data, simply a continuation of an interrupted write operation so that further programming can be performed in-situ (i.e. in the same memory cells that contain the partially written data). Accordingly, when a partially programmed portion of a non-volatile memory is found (e.g. as shown in FIG. 10) the partially programmed portion may be further programmed to a fully programmed condition by restarting the programming operation with a correct copy of the same data, e.g. a known good copy obtained by ECC correction, or from storage elsewhere (e.g. a host). FIG. 12 shows data 1244 read from block 1200 to buffer 1240. Data 1244 is decoded by ECC decoder 1242 which may provide an error rate, BER(n), for the process of FIG. 10 (a reference word line may be similarly read and decoded to provide a reference error rate, e.g. BER(ref)). When data 1244 is found to be partially written, ECC decoder 1242 may provide a corrected copy of data 1244 to buffer 1240. Alternatively, a corrected copy of data 1244 may be found at another location. For example, a host may maintain a copy of data that is not confirmed as written and may resend such a copy after a power loss. A corrected copy of data 1244 is then written back from buffer 1240 to the same location (WL(n) of string 1) by initiating a write operation.

Figure 13:
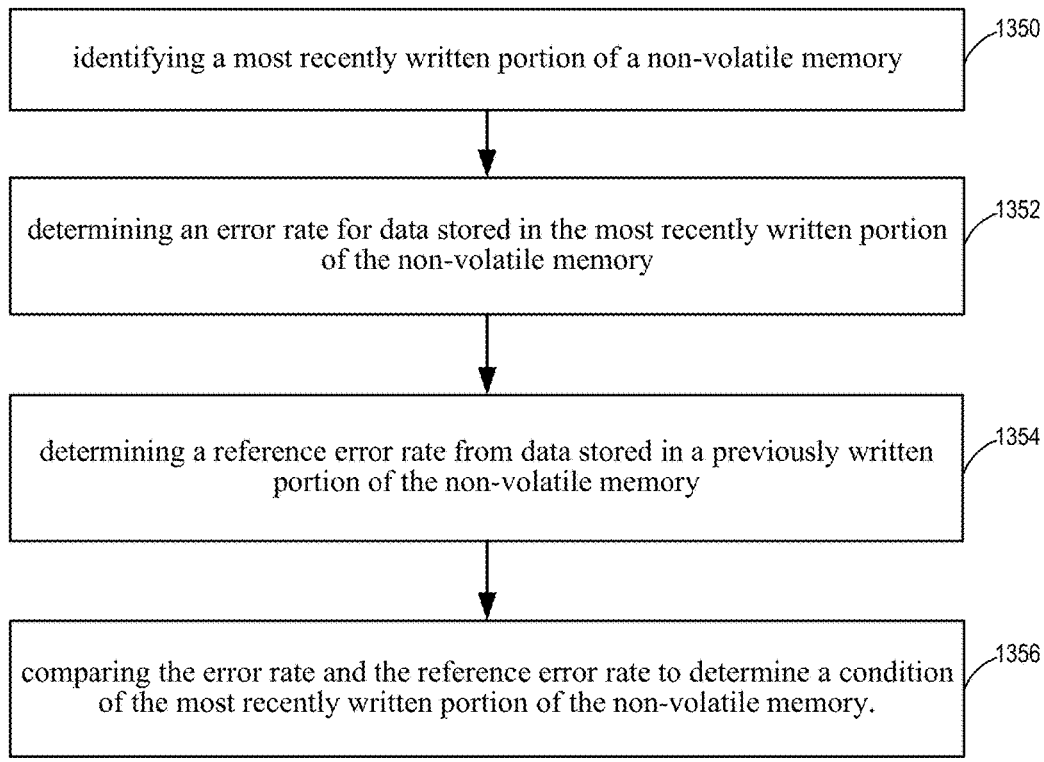
FIG. 13 illustrates a method of determining a condition of a most recently written portion of a non-volatile memory.

FIG. 13 illustrates an example of a method that may be implemented in a non-volatile memory, e.g. in flash memory structure 126 of memory die 108. A most recently written portion of a non-volatile memory is identified 1350, e.g. by a controller performing a binary search of the non-volatile memory, or a portion of the non-volatile memory. An error rate is determined 1352 for data stored in the most recently written portion of the non-volatile memory, e.g. by read circuits reading out the data and an ECC decoder performing ECC decoding, or by a comparison circuit comparing with a known good copy. A reference error rate is determined 1354 from data stored in a previously written portion of the non-volatile memory, e.g. from a nearby word line, which may be in the same block, or in a neighboring block. The error rate and the reference error rate are compared 1356 to determine a condition of the most recently written portion of the non-volatile memory, e.g. compared by a controller to determine if the most recently written portion is in a fully written condition or a partially written condition.

Figure 14A:
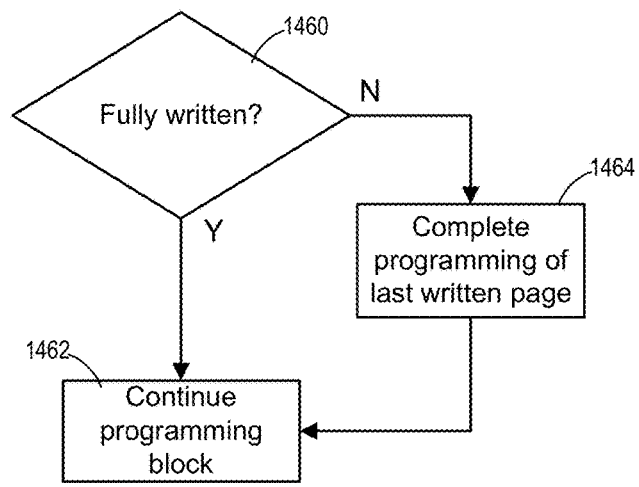
FIG. 14A illustrates a method of programming based on determining a condition of data in a last written page of a block.

FIG. 14A illustrates an example of a method that is based on the condition of a portion of non-volatile memory, e.g. a condition of the most recently written portion as fully written or partially written as found in step 1356. If the most recently written portion of non-volatile memory is fully written 1460, then programming of the block containing the most recently written portion of the non-volatile memory continues 1462, e.g. programming of the next word line in the block. If the last written portion of the non-volatile memory is not fully written 1460 then programming of the last written portion is completed 1464 and then programming of the block containing the most recently written portion of the non-volatile memory continues 1462.

Figure 14B:
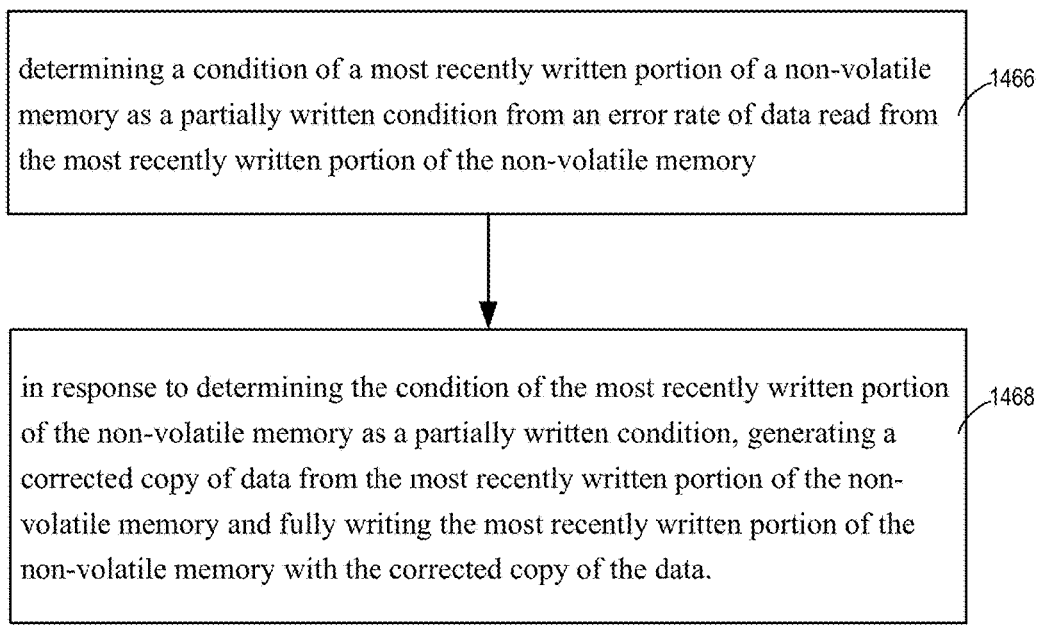
FIG. 14B illustrates a method of fully writing data in partially written memory cells.

FIG. 14B illustrates a method that includes determining a condition of a most recently written portion of a non-volatile memory as a partially written condition from an error rate of data read from the most recently written portion of the non-volatile memory 1466 and in response to determining the condition of the most recently written portion of the non-volatile memory as a partially written condition, generating a corrected copy of data from the most recently written portion of the non-volatile memory and fully writing the most recently written portion of the non-volatile memory with the corrected copy of the data 1466.

Figure 15:
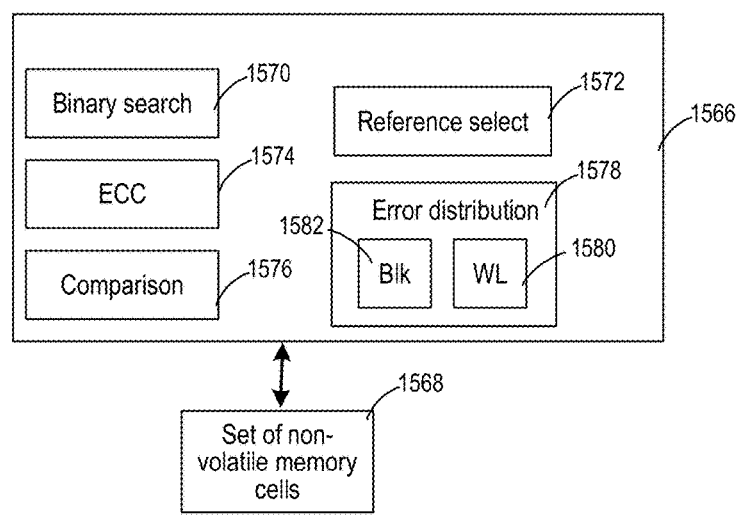
FIG. 15 illustrates an example of control circuits in communication with a set of non-volatile memory cells.

Aspects of the present technology may be implemented using various components. FIG. 15 shows an example implementation that includes control circuits 1566 (which may be embodied in one or more controllers such as controller 122, including in back end module 210) in communication with a set of non-volatile memory cells 1568 (which may be flash memory cells, ReRAM memory cells, PCM memory cells, or other non-volatile memory cells).

Control circuits 1566 include binary search circuit 1570 that is configured to perform a binary search of the set of non-volatile memory cells 1568, or a portion of the set of non-volatile memory cells 1568 to identify a most recently written portion of the set of non-volatile memory cells 1568. Reference select circuit 1572 is configured to identify a reference portion of the set of non-volatile memory cells 1568 (e.g. a portion that is in the same block as the most recently written portion, or a similar location in a neighboring block). ECC engine 1574 is configured to calculate an error rate (e.g. BER) for data from the most recently written portion of the set of non-volatile memory cells and to calculate a reference error rate for data from the reference portion identified by reference select circuit 1572. ECC engine 1574 may be considered a means for obtaining error rates for data stored in word lines of the set of non-volatile memory cells 1568. Comparison circuit 1576 is configured to compare the error rate of data stored in the most recently written portion with the reference error rate from the reference portion of the set of non-volatile memory cells to determine whether the most recently written portion is fully written or partially written. Error distribution data may be used in performing this calculation, e.g. to provide an error rate limit based on the reference error rate where the error rate limit adjusts for expected variation. Comparison circuit 1576 may be considered as an example of means for comparing a first error rate for a most recently written word line of the set of non-volatile memory cells 1568 and a reference error rate for a fully written word line of the set of non-volatile memory cells 1568. Error distribution storage 1578 stores word line to word line error distribution data 1580 and block to block error distribution data 1582 to allow adjustment whether a reference word line is in the same block, or a different block. In other configurations other error distribution data may be maintained in error distribution storage 1578. Error distribution storage 1578 may be considered an example of means for recording error rate distribution information for the set of non-volatile memory cells 1568.

While control circuits 1566 may be implemented in a single die (e.g. a controller die or chip, such as an ASIC), control circuits 1566 may also be implemented using discrete components in addition to, or instead of a single controller. Some or all components of control circuits 1566 may be configured using software (e.g. firmware) operating in a controller or other integrated circuits. Some or all components of control circuits 1566 may be configured using programmable logic in a programmable logic device (PLD).

An example of a non-volatile storage apparatus includes a set of non-volatile memory cells; and one or more control circuits in communication with the set of non-volatile memory cells, the one or more control circuits are configured to identify a most recently written portion of the set of non-volatile memory cells and to compare an error rate of data stored in the most recently written portion with a reference error rate from a reference portion of the set of non-volatile memory cells to determine whether the most recently written portion is fully written or partially written.

The most recently written portion may be a word line along a boundary between a written portion of the set of non-volatile memory cells and an unwritten portion of the set of non-volatile memory cells. The set of non-volatile memory cells may include a block in a block-erasable non-volatile memory, the most recently written portion may be a word line in the block, the reference portion may be a reference word line in the block. The reference word line may be a fully written word line that is located close to the word line in the block. The one or more control circuits may be configured to store error rate distribution data for the set of non-volatile memory cells, and the one or more control circuits may be configured to compare the error rates of data stored in the word line in the block and the reference word line according to a distribution of error rates for word lines within blocks of the set of non-volatile memory cells. The set of non-volatile memory cells may include at least a first block and a second block in a block-erasable non-volatile memory, the most recently written portion may be a word line in the first block, and the reference portion may be a reference word line in the second block. The second block may be physically adjacent to the first block and the reference word line may be similarly located in the second block as the word line is located in the first block. The one or more control circuits may be configured to store error rate distribution data for the set of non-volatile memory cells, and the one or more control circuits may be configured to compare the error rates of data stored in the word line in the first block and the reference word line in the second block according to a distribution of error rates from block to block of the set of non-volatile memory cells. The one or more control circuits may be configured to generate a corrected copy of data from the most recently written portion and to fully write the corrected copy to the most recently written portion without erasing the most recently written portion. The set of non-volatile memory cells may be monolithically formed in one or more physical levels of arrays of memory cells having an active area disposed above a silicon substrate.

An example of a method includes determining a condition of a most recently written portion of a non-volatile memory as a partially written condition from an error rate of data read from the most recently written portion of the non-volatile memory; and in response to determining the condition of the most recently written portion of the non-volatile memory as a partially written condition, generating a corrected copy of data from the most recently written portion of the non-volatile memory and fully writing the most recently written portion of the non-volatile memory with the corrected copy of the data.

The method may include identifying the most recently written portion of the non-volatile memory by performing a binary search of the non-volatile memory to identify a boundary between a written portion and an unwritten portion. Determining the condition may include performing error correction code (ECC) decoding of data read from the most recently written portion of the non-volatile memory to obtain the error rate. The most recently written portion of the non-volatile memory may be a most recently written word line in a block and determining the condition of the most recently written portion of the non-volatile memory may include comparing the error rate with a reference error rate from a previously written portion of the block or a neighboring block. The method may include: determining whether the block contains a fully written portion that is representative of the block; in response to determining that the block contains a fully written portion that is representative of the block, using the fully written portion as the previously written portion to determine the reference error rate; and in response to determining that the block does not contain a fully written portion that is representative of the block, using a portion of the neighboring block as the previously written portion to determine the reference error rate. Determining the condition of the most recently written portion of a non-volatile memory as a partially written condition may include: determining a reference error rate from data stored in a previously written portion of the non-volatile memory; and comparing the error rate and the reference error rate to determine the condition of the most recently written portion of the non-volatile memory. The method may include determining that a power loss has occurred and in response initiating the determining the condition of the most recently written portion of the non-volatile memory as a partially written condition. The method may further include maintaining error rate distribution data for the non-volatile memory and determining the condition of the most recently written portion of the non-volatile memory as a partially written condition may include using error rate distribution data to compare an error rate for data from the most recently written portion of the non-volatile memory with a reference error rate from a fully written portion of the non-volatile memory.

An example of a system includes: a set of non-volatile memory cells; means for obtaining error rates for data stored in word lines of the set of non-volatile memory cells; means for recording error rate distribution information for the set of non-volatile memory cells; and means for comparing a first error rate for a most recently written word line of the set of non-volatile memory cells and a reference error rate for a fully written word line of the set of non-volatile memory cells according to the error rate distribution information to determine if the most recently written word line was partially written or fully written.

The system may further include means for selecting the previously written word line for obtaining the reference error rate from a word line of a block that includes the most recently written word line or from another block that is adjacent to the block that includes the most recently written word line.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a set of non-volatile memory cells; and
one or more control circuits in communication with the set of non-volatile memory cells, the one or more control circuits are configured to identify a most recently written page of a block of the set of non-volatile memory cells, identify a reference page in the set of non-volatile memory cells, decode data from the most recently written page and the reference page to obtain respective error rates, and to compare an error rate of data stored in the most recently written page with a reference error rate that is obtained from decoding of data read from the reference page of the set of non-volatile memory cells to determine whether the most recently written page is fully written or partially written.

2. The non-volatile storage apparatus of claim 1 wherein the most recently written page is a word line along a boundary between a written portion of the block and an unwritten portion of the block.

3. The non-volatile storage apparatus of claim 1 wherein the most recently written page is a word line in the block, the reference page is a reference word line in the block.

4. The non-volatile storage apparatus of claim 3 wherein the reference word line is a fully written word line that is located close to the word line in the block.

5. The non-volatile storage apparatus of claim 3 wherein the one or more control circuits are configured to store error rate distribution data for the set of non-volatile memory cells, and the one or more control circuits are configured to compare the error rates of data stored in the word line in the block and the reference word line according to a distribution of error rates for word lines within blocks of the set of non-volatile memory cells.

6. The non-volatile storage apparatus of claim 1 wherein the set of non-volatile memory cells includes at least an additional block, the most recently written page is a word line in the block, and the reference page is a reference word line in the additional block.

7. The non-volatile storage apparatus of claim 6 wherein the additional block is physically adjacent to the block and the reference word line is similarly located in the additional block as the word line is located in the first block.

8. The non-volatile storage apparatus of claim 6 wherein the one or more control circuits are configured to store error rate distribution data for the set of non-volatile memory cells, and the one or more control circuits are configured to compare the error rates of data stored in the word line in the block and the reference word line in the additional block according to a distribution of error rates from block to block of the set of non-volatile memory cells.

9. The non-volatile storage apparatus of claim 1 wherein the one or more control circuits are configured to generate a corrected copy of data from the most recently written page and to fully write the corrected copy to the most recently written page without erasing the most recently written page.

10. The non-volatile storage apparatus of claim 1 wherein the set of non-volatile memory cells are monolithically formed in one or more physical levels of arrays of memory cells having an active area disposed above a silicon substrate.

11. A method of identifying a partially written page, comprising:
- identifying a most recently written page in a partially written block;
- reading first data from the most recently written page;
- determining a first error rate of the first data;
- determining that the first data is correctable based on the first error rate;
- identifying a reference page in the non-volatile memory;
- reading second data from the reference page;
- determining a second error rate of the second data; and
- determining a condition of the most recently written page as a partially written condition from comparison of the first error rate and the second error rate.

12. The method of claim 11 further comprising identifying the most recently written page in the partially written block by performing a binary search of the partially written block to identify a boundary between a written portion and an unwritten portion.

13. The method of claim 11 further comprising in response to determining the condition of the most recently written page in the partially written block as a partially written condition due to an interrupted write operation, generating a corrected copy of data from the most recently written page in the partially written block.

14. The method of claim 13 further comprising, in a continuation of the interrupted write operation, fully writing the most recently written page in the partially written block with the corrected copy of the data.

15. The method of claim 11 further comprising:
- determining whether the partially written block contains a fully written page that is representative of the partially written block;
- in response to determining that the partially written block contains a fully written page that is representative of the partially written block, using the fully written page as the reference page to determine the reference error rate; and
- in response to determining that the partially written block does not contain a fully written page that is representative of the partially written block, using a page of a neighboring block as the reference page to determine the reference error rate.

16. The method of claim 11 wherein determining the condition of the most recently written page as a partially written condition includes:
- determining that the first error rate is less than K times the second error rate, where K is obtained from a page-to-page error distribution of error rates in a block.

17. The method of claim 11 further comprising:
- determining that a power loss has occurred and in response initiating the identifying the most recently written page in the partially written block.

18. The method of claim 11 further comprising maintaining error rate distribution data for the non-volatile memory and wherein the determining the condition of the most recently written page in the partially written block as a partially written condition includes using error rate distribution data and the second error rate to calculate an error rate limit, the most recently written page determined to be partially written if the first error rate exceeds the error rate limit.

19. A system comprising:
- a set of non-volatile memory cells;
- means for identifying a most recently written word line of a partially written block in the set of non-volatile memory cells;
- means for selecting a reference word line in the set of non-volatile memory cells;
- means for obtaining error rates for data stored in the most recently written word line and the reference word line;
- means for recording error rate distribution information for the set of non-volatile memory cells; and
- means for comparing a first error rate for the most recently written word line and a reference error rate obtained from reading and decoding data from the reference word line according to the error rate distribution information to determine if the most recently written word line was partially written or fully written, the first error rate is correctable by Error Correction Code (ECC).

20. The system of claim 19 wherein the means for selecting the reference word line is configured to select a word line of the partially written block or from another block that is adjacent to the partially written block.

* * * * *